United States Patent
Savandaiah et al.

(10) Patent No.: US 11,492,697 B2
(45) Date of Patent: Nov. 8, 2022

(54) APPARATUS FOR IMPROVED ANODE-CATHODE RATIO FOR RF CHAMBERS

(71) Applicant: APPLIED MATERIALS, INC., Santa Clara, CA (US)

(72) Inventors: Kirankumar Neelasandra Savandaiah, Bangalore (IN); Keith A. Miller, Mountain View, CA (US); Srinivasa Rao Yedla, Bangalore (IN); Chandrashekar Kenchappa, Bangalore (IN); Martin Lee Riker, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 205 days.

(21) Appl. No.: 16/908,344

(22) Filed: Jun. 22, 2020

(65) Prior Publication Data
US 2021/0395877 A1 Dec. 23, 2021

(51) Int. Cl.
*C23C 14/34* (2006.01)
*H01J 37/34* (2006.01)

(52) U.S. Cl.
CPC .......... *C23C 14/34* (2013.01); *H01J 37/3441* (2013.01); *H01J 37/3447* (2013.01)

(58) Field of Classification Search
CPC .. C23C 14/34; C23C 14/564; H01J 37/32651; H01J 37/34; H01J 37/3447; H01J 37/3441
USPC ..................................................... 204/298.11
See application file for complete search history.

(56) References Cited

U.S. PATENT DOCUMENTS

| 5,824,197 A | 10/1998 | Tanaka |
| 6,533,868 B1 * | 3/2003 | Green ................... C23C 14/50 |
| | | 118/728 |
| 8,268,142 B2 * | 9/2012 | Weichart ............. H01J 37/3438 |
| | | 204/298.14 |
| 10,546,733 B2 | 1/2020 | Savandaiah et al. |

(Continued)

FOREIGN PATENT DOCUMENTS

JP        09-111446    * 10/1995

OTHER PUBLICATIONS

Machine Translation JP 09-111446 (Year: 1995).*
International Search Report for PCT/US2021/038397, dated Oct. 13, 2021.

*Primary Examiner* — Rodney G McDonald
(74) *Attorney, Agent, or Firm* — Moser Taboada (57) ABSTRACT

Embodiments of process kits for use in plasma process chambers are provided herein. In some embodiments, a process kit for use in a process chamber includes an annular body having an upper portion and a lower portion extending downward and radially inward from the upper portion, wherein the annular body includes an inner surface having a first segment that extends downward, a second segment that extends radially outward from the first segment, a third segment that extends downward from the second segment, a fourth segment that extends radially outward from the third segment, a fifth segment that extends downward from the fourth segment, a sixth segment that extends radially inward from the fifth segment, a seventh segment that extends downward from the sixth segment, and an eighth segment that extends radially inward from the seventh segment.

17 Claims, 4 Drawing Sheets

(56) References Cited

U.S. PATENT DOCUMENTS

| | | | |
|---|---|---|---|
| 2003/0085121 A1* | 5/2003 | Powell | H01J 37/3441 |
| | | | 204/298.11 |
| 2011/0278165 A1* | 11/2011 | Rasheed | H01J 37/3411 |
| | | | 204/298.11 |
| 2013/0056347 A1 | 3/2013 | West et al. | |
| 2014/0261180 A1* | 9/2014 | Yoshidome | H01J 37/3435 |
| | | | 118/723 R |
| 2014/0261182 A1 | 9/2014 | Nakazawa et al. | |
| 2014/0262763 A1* | 9/2014 | Rasheed | C23C 14/34 |
| | | | 204/298.11 |
| 2015/0047563 A1 | 2/2015 | Chung et al. | |
| 2017/0098530 A1* | 4/2017 | Johanson | H01J 37/32651 |
| 2019/0096638 A1 | 3/2019 | Lavitsky et al. | |
| 2019/0221463 A1 | 7/2019 | Todorow et al. | |
| 2019/0362949 A1 | 11/2019 | Vishwanath | |

* cited by examiner

APPARATUS FOR IMPROVED ANODE-CATHODE RATIO FOR RF CHAMBERS

FIELD

Embodiments of the present disclosure generally relate to substrate processing equipment.

BACKGROUND

Plasma process chambers typically include a substrate support to support a substrate and a target disposed opposite the substrate support. The target provides a source of material for sputtering onto the substrate during processing. RF power is provided to the plasma process chamber to create a plasma in a processing volume disposed between the target and the substrate support. Plasma process chambers typically include process kits for protecting chamber walls from unwanted deposition and to confine the plasma. Process kits generally include a process shield. For high RF power processes, a plasma facing surface of the process shield is prone to erosion, leading to unwanted particle generation of the material that makes up the process shield and unwanted re-sputtering of the target material disposed on the process shield. The inventors have observed that shorter spacing between the target and the substrate increases the contamination and re-sputtering issues.

Accordingly, the inventors have provided improved process kits.

SUMMARY

Embodiments of process kits for use in plasma process chambers are provided herein. In some embodiments, a process kit for use in a process chamber includes an annular body having an upper portion and a lower portion extending downward and radially inward from the upper portion, wherein the annular body includes an inner surface having a first segment that extends downward, a second segment that extends radially outward from the first segment, a third segment that extends downward from the second segment, a fourth segment that extends radially outward from the third segment, a fifth segment that extends downward from the fourth segment, a sixth segment that extends radially inward from the fifth segment, a seventh segment that extends downward from the sixth segment, and an eighth segment that extends radially inward from the seventh segment.

In some embodiments, a process kit for use in a process chamber, includes: a process shield having an upper portion and a lower portion having a first portion extending vertically downward from the upper portion, a second portion extending horizontally radially inward from the first portion, and a first inner lip extending upward from the second portion, wherein an inner surface of the upper portion includes an annular groove extending radially outward beyond the lower portion to increase a process volume facing surface of the process shield; and a coolant ring configured to flow a coolant therein coupled to the upper portion of the process shield.

In some embodiments, a process chamber, includes: a chamber body having an interior volume therein; a substrate support disposed in the interior volume; a target disposed in the interior volume opposite the substrate support to at least partially define a process volume therebetween, wherein the target includes a cathode surface defined by process volume facing surfaces of the target; and a process shield disposed about the substrate support and the target to define an outer boundary of the process volume, wherein the process shield includes an anode surface defined by process volume facing surfaces of the process shield, wherein a surface area of the anode surface is greater than two times a surface area of the cathode surface.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits for use in plasma process chambers are provided herein. Process kits described herein include process shields. The inventors have observed that increasing the ratio of a plasma facing surface area of the process shield to a plasma facing surface area of a target disposed in the plasma process chamber (i.e., increasing the anode/cathode ratio) advantageously reduces contamination and re-sputtering issues. The novel process shield provides an anode/cathode ratio of about 2 or greater, for example, about 2 to about 3. In some embodiments, the process shield includes one or more annular grooves on an inner surface to increase a surface area of the anode. The process shield also extends below a substrate receiving surface of the substrate support to increase the surface area of the anode. The process shield may include a cooling ring coupled to the process shield to control a temperature of the process shield. The process kit may also include a cover ring that rests on the process shield when in a processing position and configured to define a tortuous path therebetween to reduce or prevent plasma leak through the process kit.

Figure 1:
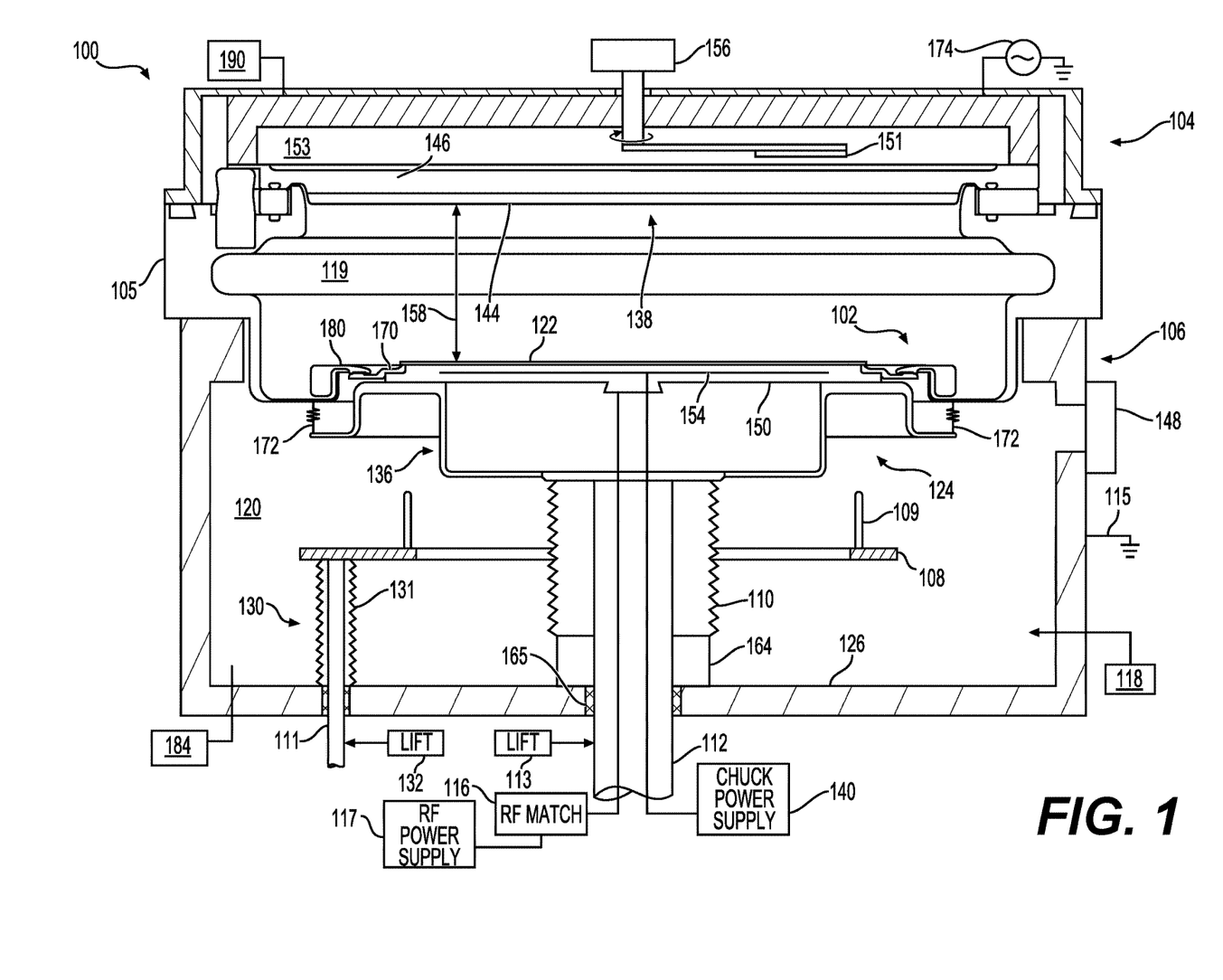
FIG. 1 depicts a schematic side view of a process chamber having a process kit in accordance with at least some embodiments of the present disclosure.

FIG. 1 depicts a schematic side view of a process chamber 100 (e.g., a plasma processing chamber) having a process kit in accordance with at least some embodiments of the present disclosure. In some embodiments, the process chamber 100 is an etch processing chamber. However, other types of processing chambers configured for different processes can also use or be modified for use with embodiments of the process kits described herein.

The process chamber 100 is a vacuum chamber which is suitably adapted to maintain sub-atmospheric pressures within an interior volume 120 during substrate processing. The process chamber 100 includes a chamber body 106 covered by a lid assembly 104 which encloses a processing volume 119 located in the upper half of the interior volume 120. The chamber body 106 and lid assembly 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise an electrostatic chuck 150 disposed on a pedestal 136 and a hollow support shaft 112 for supporting the pedestal 136 and the electrostatic chuck 150. The electrostatic chuck 150 comprises a dielectric plate having one or more electrodes 154 disposed therein. The pedestal 136 is generally made of a metal such as aluminum. The pedestal 136 is biasable and can be maintained at an electrically floating potential or grounded during plasma operation. The hollow support shaft 112 provides a conduit to provide, for example, backside gases, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of process chamber 100 to provide a flexible seal that allows vertical motion of the electrostatic chuck 150 while preventing loss of vacuum from within the process chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a chuck power supply 140 and RF sources (e.g., RF power supply 174 and RF bias power supply 117) to the electrostatic chuck 150. In some embodiments, the RF power supply 174 and RF bias power supply 117 are coupled to the electrostatic chuck 150 via respective RF match networks (only RF match network 116 shown). In some embodiments, the substrate support 124 may alternatively include AC or DC bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The platform 108 may be in the form of a hoop lift. The electrostatic chuck 150 may include through holes to receive the lift pins 109. A bellows assembly 131 is coupled between the substrate lift 130 and bottom surface 126 to provide a flexible seal which maintains the chamber vacuum during vertical motion of the substrate lift 130.

A target 138, which acts as a cathode during processing, is disposed in the processing volume 119 opposite the substrate support 124 to at least partially define a process volume therebetween. The target 140 includes a cathode surface defined by processing volume facing surfaces of the target 138. The substrate support 124 has a support surface having a plane substantially parallel to a sputtering surface of the target 138. The target 138 is connected to one or both of a DC power source 190 and/or the RF power supply 174. The DC power source 190 can apply a bias voltage to the target 138 relative to the process shield 105.

The target 138 comprises a sputtering plate 142 mounted to a backing plate 144. The sputtering plate 142 comprises a material to be sputtered onto the substrate 122. The backing plate 144 is made from a metal, such as, for example, stainless steel, aluminum, copper-chromium or copper-zinc. The backing plate 144 can be made from a material having a thermal conductivity that is sufficiently high to dissipate the heat generated in the target 138, which form from eddy currents that arise in the sputtering plate 142 and the backing plate 144 and also from the bombardment of energetic ions from generated plasma onto the sputtering plate 142.

In some embodiments, the process chamber 100 includes a magnetic field generator 156 to shape a magnetic field about the target 138 to improve sputtering of the target 138. The capacitively generated plasma may be enhanced by the magnetic field generator 156 in which, for example, a plurality of magnets 151 (e.g., permanent magnet or electromagnetic coils) may provide a magnetic field in the process chamber 100 that has a rotating magnetic field having a rotational axis that is perpendicular to the plane of the substrate 122. The process chamber 100 may, in addition or alternatively, comprise a magnetic field generator 156 that generates a magnetic field near the target 138 to increase an ion density in the processing volume 119 to improve the sputtering of the target material. The plurality of magnets 151 may be disposed in a cavity 153 in the lid assembly 104. A coolant such as water may be disposed in or circulated through the cavity 153 to cool the target 138.

The process chamber 100 includes a process kit 102 circumscribing various chamber components to prevent unwanted reaction between such components and ionized process material. The process kit 102 includes a process shield 105 surrounding the substrate support 124 and the target 138 to at least partially define the processing volume 119. For example, the process shield 105 may define an outer boundary of the processing volume 119. The process shield 105 includes an anode surface defined by processing volume facing surfaces of the process shield 105. In some embodiments, the process shield 105 is made of a metal such as aluminum.

In some embodiments, the process kit 102 includes a deposition ring 170 that rests on an outer edge of the electrostatic chuck 150. In some embodiments, the process kit 102 includes a cover ring 180 disposed on the process shield 105 to form a tortuous gas flow path therebetween. In some embodiments, in the processing position, a radially inner portion of the cover ring 180 rests on the deposition ring 170 to reduce or prevent plasma leak therebetween.

In some embodiments, a distance between the target 138 and the substrate support 124 is about 60.0 mm to about 160.0 mm when the substrate support 124 is in a processing position. In some embodiments, a distance 158 between the target 138 and the substrate 122 when the substrate support 124 is in a processing position is about 90.0 mm to about 110.0 mm. The inventors have observed that the shorter spacing between the target 138 and the substrate 122 increases contamination and re-sputtering issues because of a shrinking anode surface area. Increasing the surface area of the anode without increasing the spacing between the target 138 and the substrate 122 advantageously provides the benefits of the shorter spacing between the target 138 and the substrate 122 while decreasing contamination and re-sputtering issues. In some embodiments, a surface area of the anode surface is advantageously greater than about two times a surface area of the cathode surface to reduce contamination and re-sputtering issues.

In some embodiments, a plurality of ground loops 172 are disposed between the process shield 105 and the pedestal 136. The ground loops 172 may generally comprise a loop of conductive material, or alternatively, conductive straps, spring members, or the like, configured to ground the process shield 105 to the pedestal 136 when the substrate support 124 is in the processing position. In some embodiments, the plurality of ground loops 172 are coupled to an outer lip of the pedestal 138 so that in the processing position, the ground loops 172 contact the process shield 105 to ground the process shield 105. In some embodiments, in the transfer position, the ground loops 172 are spaced from the process shield 105.

The process chamber 100 is coupled to and in fluid communication with a vacuum system 19 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 is also coupled to and in fluid communication with a process gas supply 118 which may supply one or more process gases to the process chamber 100 for processing the substrate 122 disposed therein. A slit valve 148 may be coupled to the chamber body 106 and aligned with an opening in a sidewall of the chamber body 106 to facilitate transferring the substrate 122 into and out of the chamber body 106.

In use, while the DC power source 190 supplies power to the target 138 and other chamber components connected to the DC power source 190, the RF power supply 174 energizes the sputtering gas (e.g., from the process gas supply 118) to form a plasma of the sputtering gas. The plasma formed impinges upon and bombards the sputtering surface of the target 138 to sputter material off the target 138 onto the substrate 122. In some embodiments, RF energy supplied by the RF power supply 174 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. An additional RF power source, (e.g., RF bias power supply 117) can also be used to supply a bias voltage to the substrate support 124 to attract ions form the plasma towards the substrate 122.

Figure 2:
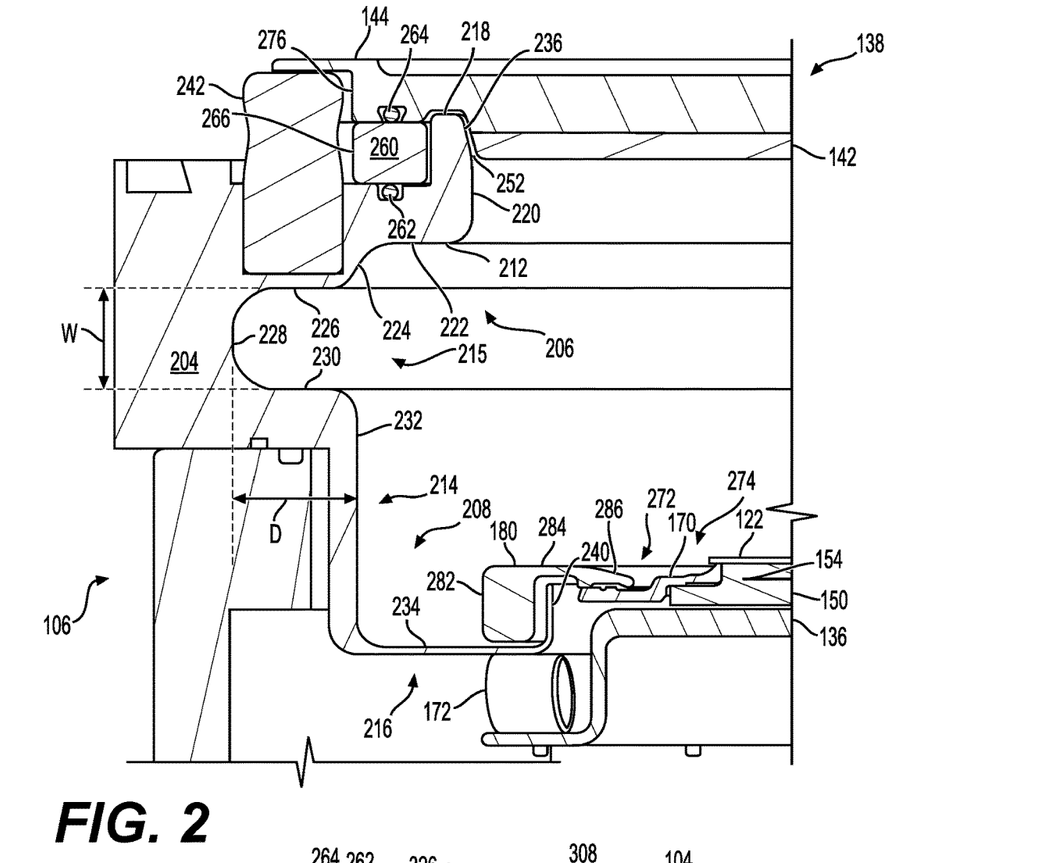
FIG. 2 depicts a partial cross-sectional side view of a process chamber having a process kit in accordance with at least some embodiments of the present disclosure.

FIG. 2 depicts a partial cross-sectional side view of a process chamber having a process kit in accordance with at least some embodiments of the present disclosure. In some embodiments, the process shield 105 includes an annular body 204 having an upper portion 206 and a lower portion 208 extending downward and radially inward from the upper portion 206. In some embodiments, the lower portion 208 has a first portion 214 extending vertically downward from the upper portion 206 and a second portion 216 extending horizontally radially inward from the first portion 214. An inner surface 212 of the annular body 204, or anode surface corresponding with the processing volume facing surface of the annular body 204, includes an annular groove 215 at the upper portion 206. In some embodiments, the annular groove 215 extends radially outward beyond the lower portion 208 to increase a surface area of the inner surface 212. In some embodiments, the annular groove 215 has a width W that is about 0.9 inches to about 3.0 inches. In some embodiments, the annular groove 215 has a width W that is about 0.8 inches to about 2.0 inches. In some embodiments, the width W is about is about 0.9 inches to about 1.1 inches. In some embodiments, the annular groove 215 has a depth D that is about 0.8 inches to about 2.0 inches. In some embodiments, the depth D is about 1.0 inches to about 1.5 inches.

In some embodiments, the inner surface 212 includes a first segment 220 that extends downward from an uppermost surface 218 of the annular body 204. In some embodiments, the inner surface 212 includes a second segment 222 that extends radially outward from the first segment 220. In some embodiments, the inner surface 212 includes a third segment 224 that extends downward from the second segment 222. In some embodiments, the inner surface 212 includes a fourth segment 226 that extends radially outward from the third segment 224. In some embodiments, the inner surface 212 includes a fifth segment 228 that extends downward from the fourth segment 226. In some embodiments, the inner surface 212 includes a sixth segment 230 that extends radially inward from the fifth segment 228. In some embodiments, the inner surface 212 includes a seventh segment 232 that extends downward from the sixth segment 230. In some embodiments, the inner surface 212 includes an eighth segment 234 that extends radially inward from the seventh segment 232. In some embodiments, the process shield 105 includes a first inner lip 240 extending upward from the eighth segment 234 or the second portion 216 of the lower portion 208. In some embodiments, the inner surface 212 includes a ninth segment 236 that extends from the first segment 220 to the uppermost surface 218. In some embodiments, the ninth segment 236 extends radially outward and upward.

A gap 252 is disposed between the target 138 and the process shield 105 to separate the anode from the cathode. For example, the gap 252 extends between the ninth segment 236 and the target 138 and between the target 138 and the uppermost surface 218 of the process shield 105. In some embodiments, an isolator ring 260 is disposed between the target 138 and the process shield 105 to electrically isolate the target 138 from the process shield 105. In some embodiments, a first o-ring 262 is disposed between an upper surface of the process shield 105 and a lower surface of the isolator ring 260. In some embodiments, a second o-ring 264 is disposed between an upper surface of the isolator ring 260 and a lower surface of the target 138.

In some embodiments, a plurality of ceramic plugs 242 are coupled to the upper portion 206 of the annular body 204 and configured to facilitate centering the target 238 to the annular body 204 to ensure that the gap 252 is substantially uniform. In some embodiments, the plurality of ceramic plugs 242 comprise three ceramic plugs arranged at regular intervals. In some embodiments, the plurality of ceramic plugs 242 extend beyond the uppermost surface 218 of the process shield 105. In some embodiments, the isolator ring 260 includes a plurality of recesses 266 corresponding with locations of the plurality of ceramic plugs 242 to accommodate the plurality of ceramic plugs 242. In some embodiments, the target 138 includes a plurality of recesses 276 corresponding with locations of the plurality of ceramic plugs 242 to accommodate the plurality of ceramic plugs 242.

In some embodiments, the cover ring 180 has an annular body. In some embodiments, a first leg 282 of the cover ring 180 extends downward from a radially outer edge of the annular body. In some embodiments, the first leg 282 is disposed radially outward of the first inner lip 240 of the process shield to define a tortuous gas flow path therebetween. In some embodiments, the cover ring 180 includes an outer portion 284 having a substantially flat upper surface and an inner portion 286 having an upper surface that extends radially inward and downward. In some embodiments, a lower surface of the inner portion 286 is configured to rest on the deposition ring 170. In some embodiments, the lower surface of the inner portion 286 includes a recessed portion 606 (see FIG. 6) that does not rest on the deposition ring 170.

In some embodiments, the deposition ring 170 rests on a peripheral notch of the electrostatic chuck 150. In some embodiments, the deposition ring 170 includes an inner portion 274 that is raised with respect to an outer portion 272 of the deposition ring 170. In some embodiments, the inner portion 286 of the cover ring 180 is configured to rest on the outer portion 272 of the deposition ring 170. In some embodiments, an upper surface of the outer portion 272 of the deposition ring 170 has a protrusion 608 (see FIG. 6) that extends into the recessed portion 606 of the cover ring 180 to create a tortuous path for any plasma that may leak between the cover ring 180 and the deposition ring 170.

Figure 3:
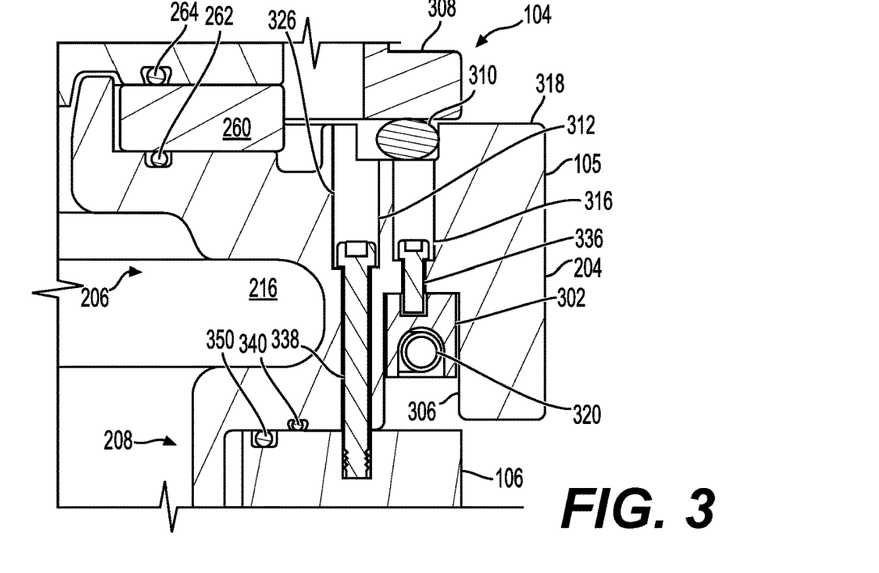
FIG. 3 depicts a partial cross-sectional side view of a process chamber having a process kit in accordance with at least some embodiments of the present disclosure.

FIG. 3 depicts a partial cross-sectional side view of a process chamber having a process kit in accordance with at least some embodiments of the present disclosure. In some embodiments, a coolant ring 302 is coupled to the upper portion 206 of the annular body 204 to cool the annular body 204. In some embodiments, the coolant ring 302 includes a coolant tube 320 disposed or embedded therein and configured to circulate a coolant therethrough. In some embodiments, the coolant ring 302 is disposed in an annular channel 306 extending from a lower surface 304 of the upper portion 206. In some embodiments, the upper portion 206 includes holes 316 extending from a top surface 318 for mounting the annular body 204 to the coolant ring 302 (e.g. via fasteners 336). In some embodiments, the holes 316 comprise 8 or more holes, for example, 16 holes.

In some embodiments, the upper portion 206 includes holes 326 extending from the top surface 318 for mounting the annular body 204 to the chamber body 106 (e.g., via fasteners 338). In some embodiments, the holes 326 comprise 4 or more holes, for example 8 holes. In some embodiments, the upper portion 206 has a wall 312 disposed between the holes 316 and the holes 326. In some embodiments, one or more locating features may be disposed between the chamber body 106 and the upper portion 206 to align the process shield 105 to the chamber body 106. For example, one or more locating pins may be coupled to the upper portion 206 and extend beyond the lower surface 304 of the upper portion 206 and into a corresponding opening in the chamber body to align the process shield 105 to the chamber body 106.

In some embodiments, a conductive spring member 310, for example an RF gasket, may be disposed between the upper portion 206 and an outer housing 308 of the lid assembly 104 to ground the outer housing 308. In some embodiments, a third o-ring 340 is disposed between the lower portion 208 and the chamber body 106 to provide a seal therebetween. In some embodiments, a fourth o-ring 350 is disposed between the lower portion 208 and the chamber body 106 to provide a seal therebetween.

Figure 4:
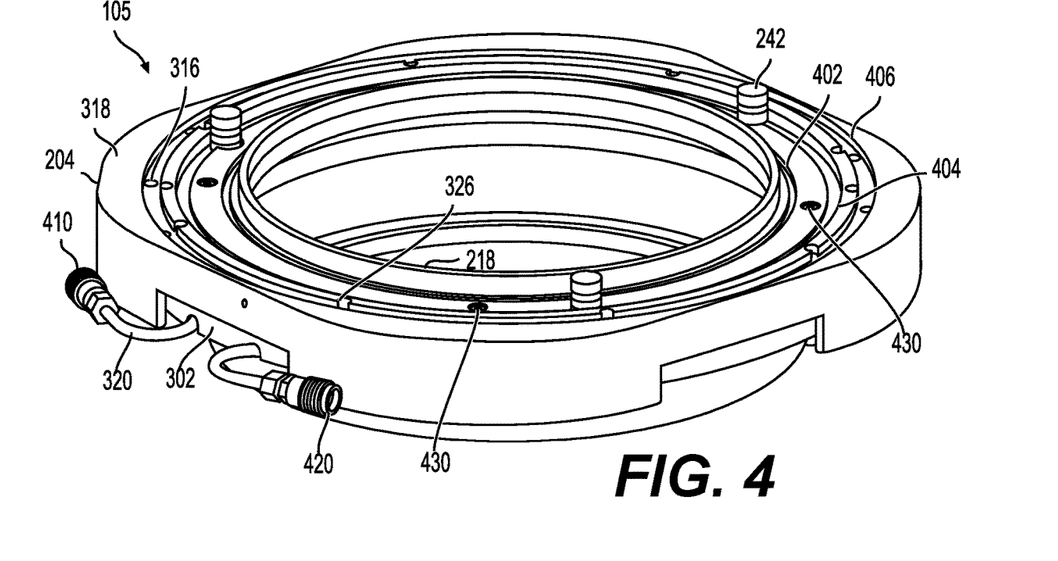
FIG. 4 depicts an isometric top view of a process shield in accordance with at least some embodiments of the present disclosure.

FIG. 4 depicts an isometric top view of a process shield in accordance with at least some embodiments of the present disclosure. The coolant tube 320 includes an inlet 410 and an outlet 420 for circulating a coolant therethrough. In some embodiments, the top surface 318 of the annular body 204 includes a first annular groove 402 to accommodate the second o-ring 264. In some embodiments, the top surface 318 of the annular body 204 includes a second annular groove 406 to accommodate the conductive spring member 310. In some embodiments, the holes 316 extend from the second annular groove 406 to the annular channel 306. In some embodiments, the holes 326 extend at least partially from the second annular groove 406 to the lower surface 304 of the upper portion 206 of the process shield 105.

In some embodiments, the top surface 318 of the annular body 204 includes an annular trap groove 404 configured to collect any coolant that leaks onto the annular body 204 from the cavity 153 in the lid assembly 104. In some embodiments, the annular trap groove 404 is disposed radially between the first annular groove 402 and the second annular groove 406. In some embodiments, the plurality of ceramic plugs 242 are partially disposed in the annular trap groove 404. In some embodiments, the annular trap groove 404 has a width of about 0.35 inches to about 0.50 inches. In some embodiments, there is a gap of about 0.05 inches to about 0.10 inches between an outer sidewall of the annular trap groove 404 and each one of the plurality of ceramic plugs 242. In some embodiments, the annular trap groove 404 comprises a plurality of trap groove arc segments that terminate proximate the plurality of ceramic plugs 242. In such embodiments, the plurality of ceramic plugs 242 are not disposed in the annular trap groove 404. In some embodiments, the top surface 318 includes a plurality of lifting holes 430 to facilitate installation and removal of the process shield 105.

Figure 5:
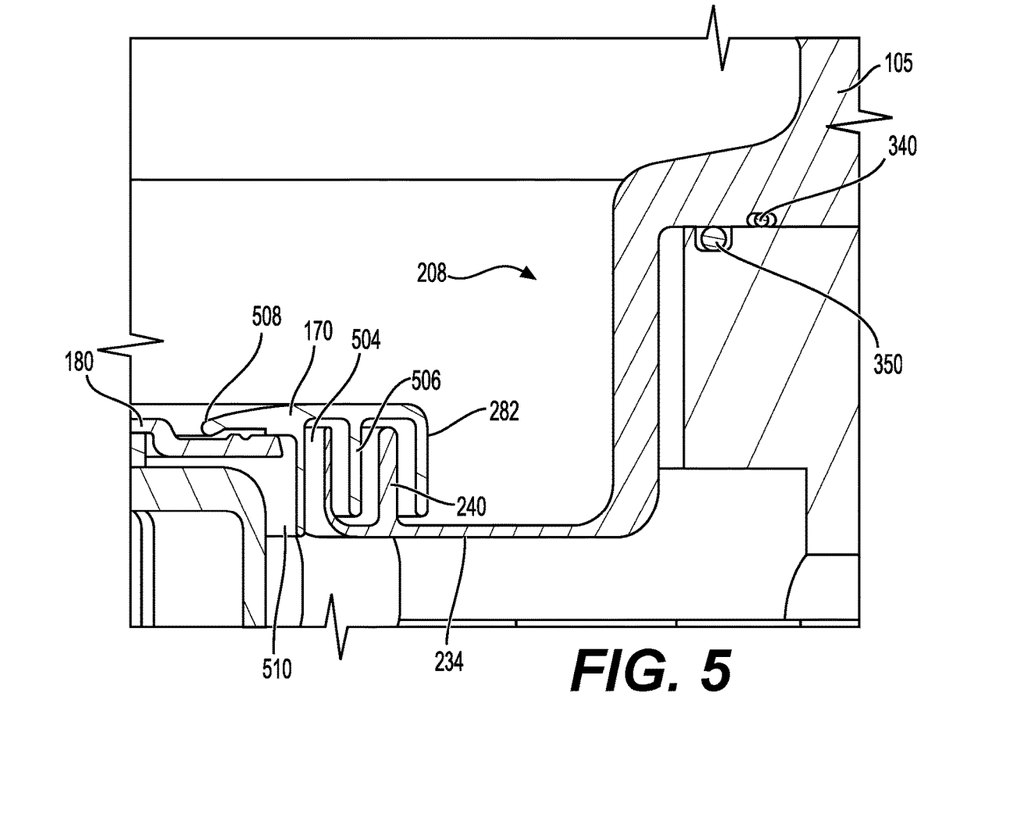
FIG. 5 depicts a partial cross-sectional side view of a process chamber having a process kit in accordance with at least some embodiments of the present disclosure.

FIG. 5 depicts a partial cross-sectional side view of a process chamber having a process kit in accordance with at least some embodiments of the present disclosure. In some embodiments, the lower portion 208 of the process shield 105 includes a second inner lip 504 extending upward from the eighth segment 234 radially inward from the first inner lip 240. In some embodiments, the second inner lip 504 extends substantially parallel to the first inner lip 240. In some embodiments, the cover ring 180 includes a second leg 506 that extends downward from the annular body of the cover ring 180 at a location between the first leg 282 and a radially inner surface 508 of the annular body. The second leg 506 extends between the first inner lip 240 and the second inner lip 504 when the cover ring 180 is disposed on the process shield 105. In some embodiments, the cover ring 180 includes a third leg 510 that extends downward from the annular body of the cover ring 180 and disposed radially inward from the second leg 506. The second inner lip 504 and the second leg 506 advantageously provide enhanced plasma confinement.

Figure 6:
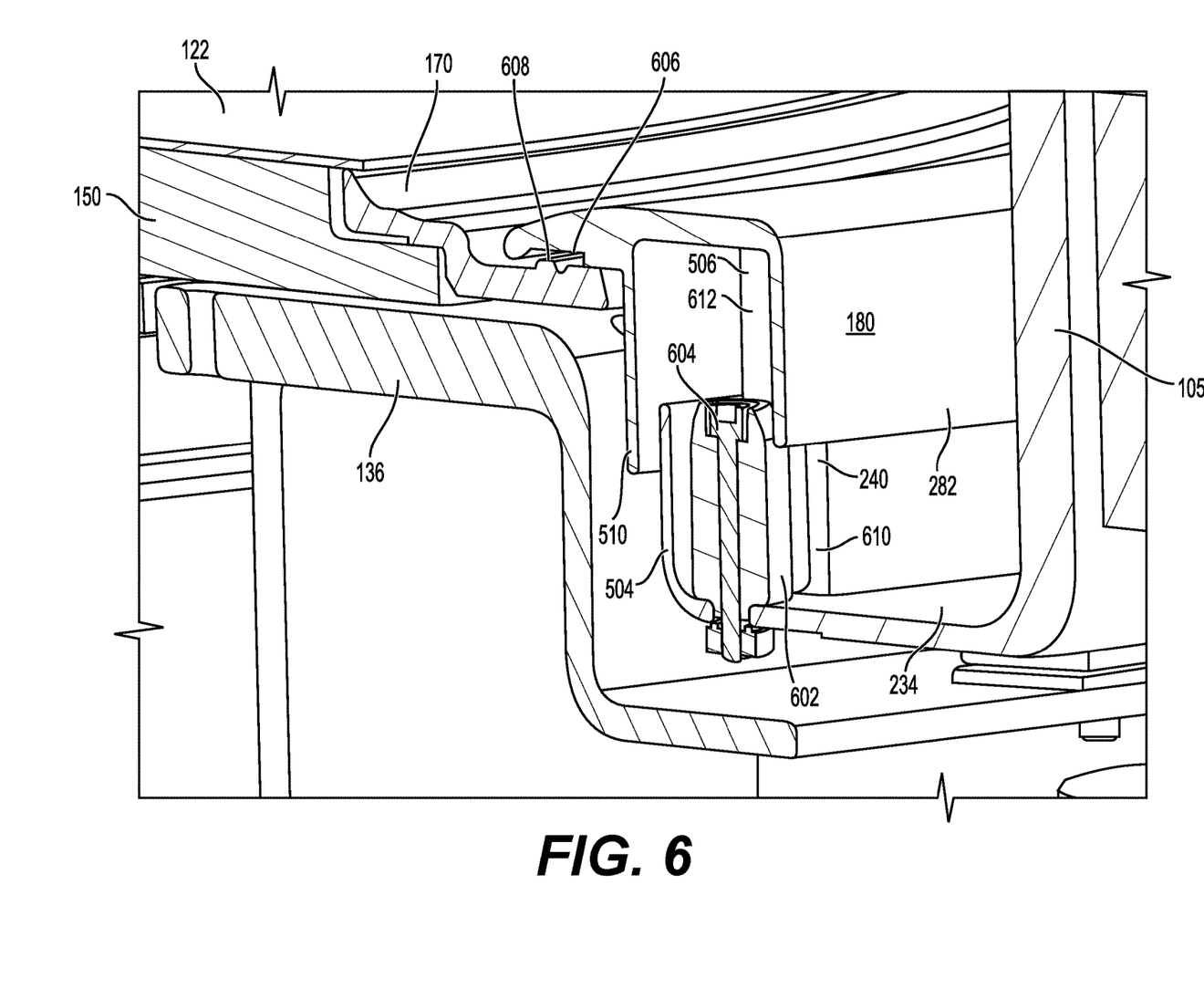
FIG. 6 depicts a partial cross-sectional view of a process chamber having the process kit of FIG. 5 in accordance with at least some embodiments of the present disclosure.

FIG. 6 depicts a partial cross-sectional view of a process chamber having the process kit of FIG. 5 in accordance with at least some embodiments of the present disclosure. In some embodiments, one or more centering bushings 602 are disposed between first leg 282 of the cover ring 180 and the second inner lip 504 of the process shield 105 configured to center the cover ring 180 to the process shield 105 when in the processing position. In some embodiments, the first inner lip 240 includes one or more cutouts 610 to accommodate the one or more centering bushings 602. In some embodiments, the second leg 506 of the cover ring 180 includes one or more cutouts 612 to accommodate the one or more centering bushings 602. In some embodiments, the one or more centering bushings 602 are coupled to the process shield 105 via corresponding one or more fasteners 604. In some embodiments, the one or more centering bushings 602 are three centering bushings.

While the foregoing is directed to embodiments of the present disclosure, other and further embodiments of the disclosure may be devised without departing from the basic scope thereof.

The invention claimed is:

1. A process kit for use in a process chamber, comprising: an annular body having an upper portion and a lower portion extending downward and radially inward from the upper portion, wherein the annular body includes an inner surface having a first segment that extends downward, a second segment that extends radially outward from the first segment, a third segment that extends downward from the second segment, a fourth segment that extends radially outward from the third segment, a fifth segment that extends downward from the fourth segment, a sixth segment that extends radially inward from the fifth segment, a seventh segment that extends downward from the sixth segment, and an eighth segment that extends radially inward from the seventh segment, wherein a top of the annular body includes an annular trap groove configured to collect any coolant that leaks onto the annular body.

2. The process kit of claim 1, further comprising a first inner lip extending upward from the eighth segment.

3. The process kit of claim 2, further comprising a second inner lip extending upward from the eighth segment radially inward from the first inner lip.

4. The process kit of claim 1, further comprising a coolant ring coupled to the upper portion of the annular body.

5. The process kit of claim 1, further comprising a plurality of ceramic plugs coupled to an upper surface of the annular body configured to facilitate centering the annular body to a target of the process chamber.

6. The process kit of claim 1, wherein the upper portion includes holes for mounting the annular body to chamber walls of the process chamber.

7. The process kit of claim 1, wherein a top surface of the annular body includes a first annular groove and a second annular groove.

8. The process kit of claim 1, wherein the inner surface includes a ninth segment that extends radially outward and upward from the first segment.

9. A process kit for use in a process chamber, comprising:
a process shield having an upper portion and a lower portion having a first portion extending vertically downward from the upper portion, a second portion extending horizontally radially inward from the first portion, a first inner lip extending upward from the second portion, a second inner lip substantially parallel to the first inner lip and radially inward of the first inner lip, wherein an inner surface of the upper portion includes an annular groove extending radially outward beyond the lower portion to increase a surface area of the inner surface;
a coolant ring configured to flow a coolant therein coupled to the upper portion of the process shield; and
a cover ring having an annular body, wherein a first leg of the cover ring extends downward from a radially outer edge of the annular body, wherein the first leg is disposed radially outward of the first inner lip of the process shield to define a tortuous gas flow path therebetween, wherein a second leg of the cover ring extends downward from the annular body at a location between the first leg and a radially inner surface of the annular body, wherein the second leg extends between the first inner lip and the second inner lip when the cover ring is disposed on the process shield.

10. The process kit of claim 9, wherein the annular groove is about 0.8 inches to about 2.0 inches wide and about 0.8 inches to about 2.0 inches deep.

11. The process kit of claim 9, further comprising one or more centering bushings disposed between first leg of the cover ring and the second inner lip of the process shield when the cover ring is disposed on the process shield to center the cover ring to the process shield.

12. A process chamber, comprising:
a chamber body having an interior volume therein;
a substrate support disposed in the interior volume;
a target disposed in the interior volume opposite the substrate support to at least partially define a process volume therebetween, wherein the target includes a cathode surface defined by process volume facing surfaces of the target; and
a process shield disposed about the substrate support and the target to define an outer boundary of the process volume, wherein the process shield includes an anode surface defined by process volume facing surfaces of the process shield, wherein a surface area of the anode surface is greater than two times a surface area of the cathode surface, and wherein the process kit as described in claim 1 forms the process shield.

13. The process chamber of claim 12, wherein a distance between the target and the substrate support is about 60.0 mm to about 160.0 mm in a processing position.

14. The process chamber of claim 12, further comprising a plurality of ceramic plugs coupled to a top surface of the process shield to align the process shield with the target.

15. The process chamber of claim 12, wherein the process shield includes a coolant ring configured to flow a coolant therethrough.

16. The process chamber of claim 12, further comprising a plurality of ground loops coupled to the substrate support and configured to contact the process shield to ground the process shield when the substrate support is in a processing position.

17. A process kit for use in a process chamber, comprising:
an annular body having an upper portion and a lower portion extending downward and radially inward from the upper portion, wherein the annular body includes an inner surface having a first segment that extends downward, a second segment that extends radially outward from the first segment, a third segment that extends downward from the second segment, a fourth segment that extends radially outward from the third segment, a fifth segment that extends downward from the fourth segment, a sixth segment that extends radially inward from the fifth segment, a seventh segment that extends downward from the sixth segment, an eighth segment that extends radially inward from the seventh segment, a first inner lip extending upward from the eighth segment, and a second inner lip extending upward from the eighth segment radially inward from the first inner lip.

* * * * *